United States Patent [19]

Takiyama et al.

[11] Patent Number: 4,490,410

[45] Date of Patent: Dec. 25, 1984

[54] METHOD OF AFFIXING A DECORATIVE PATTERN TO A STOCK OR A MOLDED COMPONENT

[75] Inventors: Eiichiro Takiyama, Kamakura, Japan; Toshikazu Tsukui, deceased, late of Sakai, Japan, by Kiyoko Tsukui, legal representative; Katsuhisa Morita; Seiichi Takano, both of Takasaki, Japan

[73] Assignee: Showa Highpolymer Co., Ltd., Tokyo, Japan

[21] Appl. No.: 496,626

[22] Filed: May 20, 1983

[51] Int. Cl.³ .............................................. B05D 3/06
[52] U.S. Cl. .................................. 427/44; 427/54.1; 427/146
[58] Field of Search ............... 427/44, 54.1, 146, 147, 427/150

[56] References Cited

U.S. PATENT DOCUMENTS

| | | | |
|---|---|---|---|
| 3,870,539 | 3/1975 | Glaser et al. | 427/146 |
| 4,222,835 | 9/1980 | Dixon | 427/54.1 |
| 4,337,289 | 6/1982 | Reed et al. | 427/149 |

*Primary Examiner*—John H. Newsome
*Attorney, Agent, or Firm*—Wenderoth, Lind & Ponack

[57] ABSTRACT

A method for freely affixing a decorative pattern having a very excellent deep appearance on any stock or shaped body is provided, said method comprising coating said stock or shaped body with an active energy beam curable resin; placing a pattern-printed film so as to contact the resin with the pattern at a stage where the resin still remains in a liquid or sticky gelled state prior to curing, said pattern being printed with an ink having a greater affinity to said resin than said film, irradiating a beam toward the pattern-printed film-resin coated body to cure the resin concomitantly transferring the pattern on the film to the cured resin surface, removing the film and thereafter coating the transferred pattern bearing cured resin surface with a transparent or translucent resin.

5 Claims, 3 Drawing Figures

METHOD OF AFFIXING A DECORATIVE PATTERN TO A STOCK OR A MOLDED COMPONENT

THE FIELD OF THE INVENTION

The present invention relates to a method of affixing any desired pattern on the surface of inorganic or organic stock or molded component to achieve a product with superior appearance and a highly enhanced value.

BACKGROUND OF THE INVENTION

In recent years, remarkable efforts have been made in the sensous aspect of goods for increasing the added value thereof, for example, by upgrading the visual appeal, in addition to upgrading the substantial aspect of goods, such as an improvement of their physical properties, etc.

However, up to now, a technique for printing a design of a satisfactory appearance on a preformed component or stock is not readily available. As a method of patterning a molded component having desired shape and consisting of a wide variety of stock material, a method is known, for example, which comprises floating a desired pattern on the surface of water, placing said component on said pattern, forcing said component down under the surface of water thereby applying said pattern to the surface of said component by water pressure, and drying to impart a similar effect to printing. This method, has problems in productivity and the outward appearance of the resulting product has a so-called flat appearance, which make said method unsatisfactory.

With the upgrading of construction materials in recent years, many approaches have been tried in an effort to impart a pattern to molded components of hydraulically setting materials such as plaster of paris, cement, etc. so as to enhance the value.

Japanese Patent Laid Open 52965/77, for example, discloses a method of in-mold decorating comprised of printing a decorative pattern on a sheet using a water soluble ink, molding said sheet to a desired form, casting a slurry of hydraulically setting material to cure said material, while transferring said printed pattern to the surface of the hydraulically cured material by dissolving out the water soluble ink. This method has many advantages. However, prior methods including the above method have serious drawbacks. One of said drawbacks of the above-mentioned Japanese Patent Laid Open application, for example, is a lack of water resistance because of the use of water soluble ink and thus upon immersion in water, the decorative pattern disappears, which imposes a severe limitation in the application of said printed material and also which makes it unsuitable to use as a construction material. On the other hand, if a decorative delicate rock vein is printed on a material, especially on a hydraulically cured component by a prevailing method such as the thermographic transfer process or sublimation transfer process, the printed decorative pattern has a drawback in the difficulty in reproducing a sharp high fidelity rock vein due to the propensity towards obscuring of the printed pattern, which comes from the poor deposition of ink.

Flexographic printing using rubber plates is suited to the printing of wood veins but has similar defect in the printing of rock veins.

SUMMARY OF THE INVENTION

The object of the invention is to provide a method for freely affixing a decorative pattern on any stock or preformed component of any stock without the drawbacks of the prior methods.

According to the present invention the method comprises applying a coating of activated energy ray-curable resin on the surface of a stock or preformed material; placing at a stage where the resin still remains in a liquid or sticky gelled state prior to curing, a pattern-printed film so as to contact the resin with the pattern said decorative pattern being printed with an ink which has affinity to said resin; irradiating an activated energy beam toward the film to cure the resin, simultaneously transferring the pattern from the film to the cured resin surface, removing the film and further applying a transparent or translucent resin to the pattern transferred surface.

The present invention can be applied to a wide variety of inorganic or organic stock or preformed material thereof as hereinafter described. However, it is especially advantageous to apply it to a stock of water-resistant hydraulically cured material such as cement, because it can provide a hydraulically cured formed product that includes cement and gypsum products regardless of the type of hydraulically cured material having a water-and weather resistant decorative pattern with a depth and beauty in appearance not seen in the prior art, which makes the product especially suitable as a water-resistant construction component. In this regard, the use of water-soluble ink as in the prior art makes it difficult to retain the printed decorative pattern, even if the substrate on which the pattern is printed is water-resistant. The present invention eliminates such defects.

The activated energy ray curable resin herein referred to includes a resin radically curable with a energy beam having a wavelength of a 400 m$\mu$ or less, such as electron rays and ultraviolet light or sunlight, which means a resin addition curable type and thus it is referred to as photocurable resin. Also photocuring means the curing by the use of above-mentioned light source. The photocurable resin can contain a photosensitizer as is well known in the art. Further, we have also found that if the photocurable resin contains only a photosensitizer type and if the printed decorative pattern contains a deep colored or black colored part, then the irradiation of UV or sun light can only provide an inadequately cured or uncured photocurable resin existing under that part of the pattern which makes it impossible to transfer the pattern of that part.

According to one preferred embodiment of the present invention in such a case, the photocurable resin should contain an organic peroxide known per se in the art, in addition to the photosensitizer. Thus the photocurable resin herein referred to includes a photocurable resin containing both a photosensitizer and an organic peroxide. In this connection, the use of a combination of an organic peroxide and an accelerator requires several ten minutes for curing during which there is a propensity for a blot of printed ink to occur, dimming the pattern and also a segregation of color develops. On the other hand, a conventional elevated temperature curing in which the resin contains no accelerator requires also an order of several minutes because the heating of the stock itself is additionally required even though the temperature of the atmosphere is elevated. In addition, a defect also occurs such that a deformation of the film develops due to an elongation of the thermoplastic film at high temperature thus making it impossible to form a smooth transfer surface.

In contrast to the above, according to the above-mentioned preferred embodiment, the irradiation in the presence of a photosensitizer and an organic peroxide in combination enables the organic peroxide to satisfactorily work at a lower temperature, such as room temperature, than that at which the organic oxide can perform its function, to contribute the curing of the resin within a period of time measured by the second unit so that the resin under a deep colored or black colored pattern can be cured simultaneously with the resin under a transparent patternless film, thereby eliminating all the troubles occurring from the long period of contact of the printed film with said resin usually required in the prior art.

BRIEF DESCRIPTION OF THE DRAWING

The method of the present invention will be more clearly illustrated with reference to the drawings, in which.

DETAILED DESCRIPTION OF A PREFERRED EMBODIMENT

Figure 1:
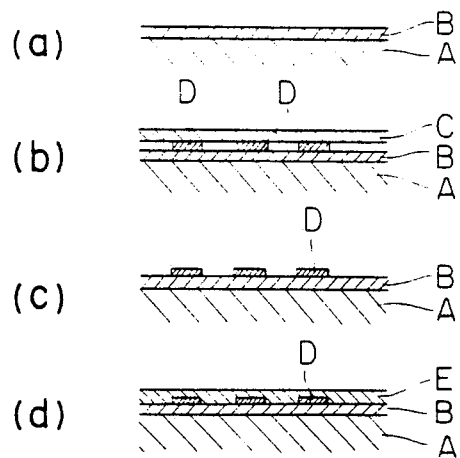
FIG. 1 illustrates a sequence of the fabrication steps of decorative pattern printed product in accordance with the present invention.

Now, referring to FIG. 1, there are illustrated fabrication steps of a decorative pattern printed product according to the present invention wherein a photocurable resin B is coated on the surface of a stock material i.e. a substrate or a preformed material A (step a). A decorative pattern printed film C, the ink of said pattern (D) having an affinity for said resin (B) is placed on the substrate prior to the curing, i.e. when the said resin is in a sticky gel condition, with the printed face of the film contacting the resin (step b). The resin is cured by the irradiation of an activated energy ray with the concomitant transfer of printed decorative pattern (D) on the resin layer (step c). Then the film is removed and another transparent or translucent resin (E) is coated on the surface of the printed product (step d).

The stock material or substrate or preformed body (A) employed in accordance with the present invention may be organic or inorganic ones on which a decorative pattern printed film can be attached.

Examples of these materials typically include the following:

(i) a naturally occurring organic material and a workpiece derived therefrom such as hide, wood, or processed wood product such as plywood, chipboard, particle board etc.

(ii) a naturally occurring inorganic material such as metals, stone, naturally occurring slate.

(iii) artificial organic materials such as paper sheet, synthetic paper sheet, unwoven sheet, fabrics, synthetic leather, and a wide variety of plastics such as polycarbonate, polymethylmethacrylate, polystyrene, polyvinyl chloride, polypropylene, resin concrete, ABS, FRP (fiber reinforced plastics).

(iv) artificial inorganic materials such cured products derived from cement, plaster of paris, a mixture of plaster of paris and cement and magnesia cement products; calcium silicate, slate, magnesium carbonate, bisque and brick and the like. These are by way of example to name only a few. These materials may optionally seal off the surface if desired. Among the above stock materials or preformed bodies, (i), (iii) and (iv) are especially preferred. With the material (iii) or (iv), they may contain an aggregate, a reinforcing material such as fiber glass, asbestos fibers, rock wools and organic fibers and a coloring agents.

The photocurable resin (B) employed in accordance with the present invention includes radically curable ones, i.e. an unsaturated polyester resins, vinylester resins and various unsaturated acrylate resins. These resins should contain no non-reactive solvent. The resin can be applied in a liquid state or a gelled conditioned. These resins can also be employed in combination.

The unsaturated polyester resin herein employed comprises an unsaturated alkyd prepared by subjecting $\alpha,\beta$-unsaturated polybasic acid generally in combination with any saturated polybasic acid and a polyhydric alcohol, dissolved in a polymerizable monomer, to esterification.

The vinyl ester resin employed herein comprises a prepolymer containing one or more acryloyl or methacryloyl groups per molecule dissolved in a monomer commonly employed to cross-link with said acryloyl or methacryloyl unsaturation, said prepolymer being derived from a reaction of an epoxy resin having one or more epoxy groups and an acrylic or methacrylic acid.

Unsaturated acrylate resins include a plurality of resins. The vinylester resin set forth above falls within the scope of the unsaturated acrylate resin. The vinylester resin, however, is customarily independent from the unsaturated acrylate resin.

As the unsaturated acrylate resins herein employed there may be mentioned typically (i) a polyester resin (including an alkyd for painting), (ii) polyurethane resin, (iii) spiroacetal resin, (iv) melamine resin and (v) polyester resin, all of the above listed resins containing one or more acryloyl or methacryloyl groups. These resin are employed with or without any monomer. For photocuring the above-mentioned radically curing type resins, incorporation of a radical generating catalyst, i.e. a photoinitiator is necessary when UV or sunlight is used. In such a case a conventional photoinitiator such as benzoin and ethers thereof, benzophenone as well as its derivatives substituted on its nucleus or nuclei, thioxanthones, and dibenzyl ketals may be used.

As the organic peroxide employed in combination with the photoinitiator, there may be used conventional ones such as, typically, ketone peroxides, acyl peroxides and hydroperoxides. However, the use of electron rays as the light source permits the cold cure of above-mentioned resins without incorporation of the optical sensitizer or organic peroxide in combination with the former, and thus is well suited in carrying out the present invention. As the film (C) on which an appropriate decorative pattern is to be printed, a plastic film is suitable, among which polypropylene, polyethylene, polyethylene terephthalate and the like may be conveniently employed from the stand point of its cost and handling properties. In addition to the foregoing, A film of cellophane or acetal modified polyvinyl alcohol (such as vinylon, a trade name sold by Kurare Co.) may be employed. Any other film which can tentatively adhere to the liquid or gel state photocurable resin without giving rise to dissolution or to a large extent of swelling, but which can be stripped from the cured resin may also be employed. The film may be surface-treated for improving the adherence of the ink.

The printed ink with which the decorative pattern (D) is printed should have greater affinity to the cured resin than the film on which said ink is printed. Thus no particular limitation on the type of the ink should be imposed provided that said ink would have greater adhesiveness between the ink and the cured resin than that between the ink and the film.

In practice, an oil soluble ink commonly employed in gravure printing, offset printing or the like can adequately perform the purpose of the invention.

Any organic solvent, soluble type polymers or oligomers may be used as a vehicle by the printing ink. Among them are: a styrene-maleic acid copolymer or a modified copolymer or oligomer thereof containing a third component, a polyamide resin, polybutene, a xylene resin, chlorinated rubber, a petroleum resin, 100% alkylated phenolic resin, an oil soluble phenolic resin, a ketone resin, ester gum, lime-cured rosin, a rosin-maleic acid resin, a rosin modified phenolic resin, an oil-modified alkyd resin, drying oil and polymerized oil, an epoxy resin, and a cellulose derivative. In addition to the above, it is possible to use a polymer latex which is an aqueous dispersion, the dried film of which shows a lipophilic nature, polymers which are both water soluble and also oil soluble such as methyl cellulose, hydroxyethylcellulose methylhydroxy propylcellulose, polyvinyl pyrrolidone, polyvinyl methyl ether and the like.

It is also possible to use an ink which comprises a coloring agent in an organic solvent-soluble polymer rather not commonly used, by choosing an appropriate method of printing or by hand printing.

Further, a photocurable type vehicle which has had increasing application recently can be also used. These comprise mainly an unsaturated acrylate, that is, a polyester-acrylate, a vinylester resin, an epoxy-acrylate, an urethane-acrylate, or a spiroacetal-acrylate, as a principal ingredient, a polyacrylate of polyhydric alcohol in the required quantity and a photoinitiator. It should be noted that a polymer which is soluble in water but insoluble in an organic solvent is not suitable as a vehicle, because a pattern printed on a surface of hydrophilic film generally does not affix on a surface of cured lipophilic resin, besides the difficulties of printing on regular film. However, if the curable resin initially applied was a hydrophilic or a water-soluble type, it would become possible to transfer a pattern along with the curing of said resin. The hydrophilic resin in its practical aspect will maintain superiority with difficulty because in general if these hydrophilic resins cure with some increased content of water, shrinkage becomes greater with an increased risk of developing cracks or shrinkage. Thus an ink which employs a water-soluble resin as a vehicle can be used provided that a hydrophilic curable resin is selected as the initially applied base resin but there are no particular advantages due to the problems stemming from its performance. Also an ink in which a vehicle having both lipophilic and hydrophilic properties such as polyvinyl pyrrolidone can be used in some cases.

The term "printing" herein described means to draw any pattern on any desired film mechanically or by hand.

The resins employed to overcoat the cured printed assembly are classified into two groups, i.e. a thermosetting resin and a thermoplastic resin. Among the thermosetting type resins are, in addition to the above-mentioned resins, an epoxy, urethane, or phenolic resin, air-curing type alkyd, polybutadiene resin, curing type melaminealkyd etc. The thermoplastic resins employed as the overcoat should be solvent soluble, have good film forming properties with practical film performance such as hardness etc. Examples of such thermoplastic resins include styrene-homo- and copolymers, polymethylmethacrylate homopolymer and a copolymer thereof, a copolymer of polyvinylchloride and vinylacetate, a copolymer of polyvinylchloride-vinylacetate-maleic anhydride and cellulose esters. These resins are employed optionally in the form of an organic solvent solution or an aqueous emulsion. The method according to the present invention eliminates the drawbacks of the prior art by which if a water soluble printing ink is employed to draw a pattern on a hydraulically set, water-resistant stock material such as cured cement, the maintenance of the integrity of the pattern under the constant influence of moisture is difficult. However even in such a case the affixing of a pattern can be freely made in accordance with the present invention. The present invention for the first time makes it possible to produce a formed material, particularly for construction, especially of hydraulically set ones from cement or gypsum, but regardless of the nature of the hydraulically setting material, having an affixed decorative pattern which has apparent depth and beauty, as never achieved by prior processes.

The effect achievable according to the present invention and distinguishable from that of the other method resides in the fact that the decorative pattern is sandwiched between the cured base resin layer and the cured overcoat resin layer so that the apparent depth of the decorative pattern is enhanced due to the repeated refraction and transmission of the light from or through the pattern and reflection of the transmitted light from the stock material or the preform base stock. This is not an excessive emphasis of the difference in effect based, on the distinct impressions of each.

According to the present invention, a decorative pattern having such quality as being incapable of producing by printing or painting directly on the surface of stock material, i.e. substrate, by the use of previously employed ink, can freely be transferred to the material by applying a wide variety of means such as varying the nature of both base and overcoat resins, for example, changing the refractive indices, selecting as the base resin, resins with a higher refractive index than that of the overcoat or by incorporating transparent fillers in the form of beads. The advantageous effect peculiar to the present invention may be achieved upon application to a hydraulically set, formed product.

Further advantages according to the present invention reside in the rapid curing of the base coating resin on the basis of photocuring and the absence of any non-reactive solvent, which distinguishes the present method from the conventional ones. Since the photocuring occurs in a second unit of time the decorative pattern printed on a film can be precisely transfered to the stock material or the preform. In contrast to this, a conventional curing resin, such as an organic peroxide-containing unsaturated plyester requires generally several tenth of minutes before curing during which the pattern on the film in contact with the uncured resin is apt to collapse and no sharp pattern can be obtained.

If a solvent-containing resin such as polyurethane resin for paint is closely put in contact with a pattern-carrying film, evaporation of the solvent cannot be effected which makes it impossible to transfer the pattern. A process for transfering a decorative pattern where an adhesive resin layer in the form of a solution or a gel is coated on a substrate stock material, closely contacting a pattern-printed film with said resin layer, curing the resin and transferring a pattern on the substrate upon stripping the film, requires a rapid cure within as short a period of time as possible, and the photocuring employed in accordance with the present invention best meets this requirement.

Apart from the above, fast curing leads to the improvement of productivity thereby decreasing production costs. The Following Examples will illustrate the present invention.

Example 1

In a mold, 600×600×15 mm³ placed therein synthetic release paper, "Yupo" sold by Ohjiyuka a slurry comprising:

|  | part by weight |
| --- | --- |
| α-type gypsum hemihydrate | 100 |
| water | 35 |
| ¼" fiber glass | 1 |
| hydroxy ethylcellulose | 0.1 | was cast and cured.

After removing the mold, an unsaturated spiroacetal adhesive "Spilac U-3155" sold by Showa Kobunshi Kabushiki Kaisha was coated 0.2 mm thick as a base coat on the surface of the cured body by flow coater. The resultant coated body was passed under UV irradiator 20 cm removed from said body at a speed of 15 m/min. at room temperature to convert said resin to a gel. The residence time under irradiation is about 4 seconds and the irradiator has a length of 1 meter. The same irradiator is employed in all the Examples hereinafter referred to unless otherwise stated.

A polyethyleneterephthalate film having a decorative pattern of a greenish cashmere onyx type silk screen printed with an oily ink containing a styrene-maleic acid copolymer and a ketone resin in combination as a vehicle was placed on said gel-state resin surface so as to contact the pattern with the resin and uniformly roll-pressed.

The resultant assembly was again passed through the same type of irradiator at 5 m/min. with a residence time of about 12 seconds to cure the resin. Upon stripping the film, the onyx type pattern was entirely transferred to the coated resin surface.

The same resin as employed as the base coat was coated 0.2 m thick on the transferred pattern assembly with a flow-coater and the resultant product was passed under the UV irradiator with an output of 50 kW, the length of the lamp being 1.6 m removed 20 cm therefrom at 5 m/min. Thus there is produced an artificial marble having a greenish cashmere onyx type pattern having apparent depth. The artificial marble has a surface hardness of 5H, and a combination of superior contamination and cigarette resistances.

Example 2

Example 1 was repeated except that a resinous composition comprising a photocurable resin, "Spilac U-3155" (containing benzophenone as a photoinitiator) and benzoylperoxide 1 parts per 100 parts of said resin and a polyethylene-terephthalate film with a printed decorative pattern of brownish cashmere onyx were used. A synthetic marble having brownish cashmere onyx type pattern with apparent depth was obtained. The product has a surface hardness of 5, and contamination and cigarette resistances.

Comparative Example 1

Figure 2:
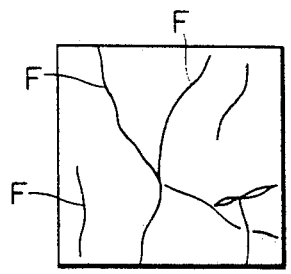
FIG. 2 elucidates a brownish onyx decorative pattern to be transferred.

Example 2 was repeated except that "Spilac U-3155" (containing a photoinitiator only) was used alone. Upon stripping the film, the base resin corresponding to the part on which the vein of the brown onyx pattern was placed as indicated in FIG. 2, was not cured and thus the pattern of said part was not transferred successfully, leading to a valueless product.

Comparative Example 2

Example 2 was repeated except that a spiroacetal resin "U-3155N" was used, said "U-3155N" contains only benzoylperoxide in the same amount as in Example 2 in the absence of a photoinitiator, benzophenone. The resin was not cured over the whole surface after passing the UV irradiator, and thus it was impossible to transfer the pattern and obtain the contemplated product.

Comparative Example 3

Example 1 was repeated except that a thermoplastic methylmethacrylate copolymer solution "Vinylol #92" was coated 0.2 mm thick on a gypsum plate and that a brownish cashmere onyx pattern printed polyethyleneterephthalate film was roll-press contacted on the coated resin layer advanced to an adhesive state to the degree of an adhesive tape as a result of standing for about 10 minutes at room temperature and let stand for 1, 3 and 7 days respectively. After stripping the film at the above intervals, the conditions were:

after 1 day: the resin remained sticky. Only part of the pattern was transferred to the resin surface with the major part of said pattern remaining on the film. The pattern transferred to the resin having faded.

after 3 days: same as above.

after 7 days: the pattern was transferred to such an extent that only part of the pattern remained on the film, but the transferred pattern collapsed and couldn't be distinctively identified.

Example 3

Figure 3:
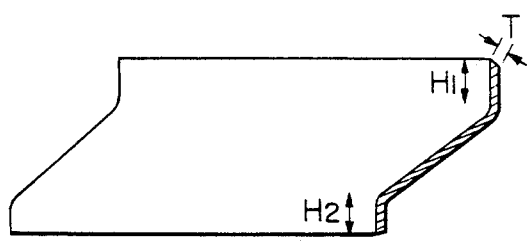
FIG. 3 shows a perspective view of the substrate or stock material employed in Example 3.

In a mold having a profile ⌐-form as shown in FIG. 3 (100 cm × 50 cm H₁ = H₂ = 10 cm, T = 3 cm) for making a preform substrate, the following composition in the form of slurry was cast.

| 85 parts | white Portland cement |
| --- | --- |
| 15 parts | white anhydrous gypsum |
| 100 parts | white silica |
| 1 part | Melment (trade name, of Showa Denko K. K., melamine resin type water reducing agent for use in cement) |
| 60 parts | water |
| 3 parts | alkali-resistant fiber glass |

After setting and standing for 3 hours the resultant product was steam-cured at a temperature of 70° C. to 75° C. for 3 hours and then let stand at room temperature.

On the preform thus obtained a vinylester resin (Lipoxy SP 1509 produced by Showa Kobunshi K. K.) was roll-coated and the coated resin let stand for 2-3 minutes under sun light to covert it to an adhesive flowable state. A polypropylene film having a Tivoli marble pattern screen-printed with an oily ink comprising a rosin-maleic acid resin based vehicle, was intimately contacted with the preform or the substrate and cured the base resin under the same conditions as in Example 1.

After curing a substrate having a completely transferred pattern on the base resin layer was produced upon stripping the film. Further, a curable polyurethane paint "Acrylic 2026 GL Clear" (Kansai Paint Co.) was spray coated 70μ thick as a overcoat.

After one day, a product having a beautiful relieved pattern against the substrate was obtained after buffing.

Example 4

A photocurable vinylester resin adhesive containing no monomer, "Ripoy VR 77" (Showa Kobunshi K. K.) which contains one part "IRGACURE #651" as a photosensitizer per 100 parts of said adhesive was uniformly dissolved in 50 parts of ethyl acetate to produce a resin solution and the resultant resin solution was spray coated about 3 mm thick on the of surface of a 5 mm thick white calcium silicate plate 300×300 mm produced by Onoda Cement K. K. After air-drying for 3 hours in a room the ethylacetate evaporated off resulting in a sticky coating.

A film having a Tivoli marble pattern as employed in Example 3 was pressed to the sticky coating and then the resultant assembly was passed under a 30 kW output VU irradiator removed 20 cm therefrom at a rate of 3 m/min. to cure the resin. A plate having a Tivoli marble pattern transferred to the calcium silicate plate was obtained upon stripping the film. A curable type polyurethane paint "Acrylic 202GL Clear" sold by Kansai Paint K. K. was spray coated about 70μ thick on the surface of the resin having the transferred pattern and the paint was cured prior to buffing. Thus a decorative calcium silicate plate was provided with a pattern having apparent depth.

Example 5

A spiroacetal type photocurable unsaturated acrylate resin "Spilac U-3163" sold by Showa Kobunshi K. K. was coated 0.2 mm thick on the surface of a transparent polycarbonate plate, 300×300×5 mm³. A polyethyleneterephthalate film having a silk-screened morning-glory flower pattern printed with an oily ink comprising an oil-modified alkyd type was pressed to the resin-coated surface of the plate with the pattern in contact with said surface and the resultant assembly was passed under 30 kW UV irradiator removed 30 cm therefrom at a speed of 5 cm/min. to cure the resin. A polycarbonate plate was obtained having a transferred flower pattern upon stripping the film.

Thus a beautiful plate having a relieved flower pattern against the substrate plate, the surface hardness of said polycarbonate plate being 5H, was obtained. The same resin as set forth above was coated 0.5 to 0.6 mm thick on the surface having the transferred pattern and cured under the same condition as above. Upon finishing by grinding and buffing, a beautiful natural walnut appearing decorative plate was obtained having such favorable properties as being resistant to contamination and cigarettes.

Example 6

A magnesium carbonate plate, 300×300 mm², produced by Nihon Hard Board K. K. was coated 0.2 mm thick with a photocurarable vinylester resin adhesive "Ripoxy SP-1509" produced by Showa Kobunshi K. K. A polyethyleneterephthalate film with a rose-red wood vein pattern printed with a rosin-modified phenolic resin type oily ink was pressed to the plate with the pattern in contact with the photocurable resin adhesive layer and the resultant assembly was passed under 30 kW output UV irradiator removed 30 cm therefrom at a speed of 5 m/min. to cure the resin adhesive.

Upon stripping the film, there is obtained a magnesium carbonate plate having a transferred wood vein pattern.

A mixed resin comprising 100 parts unsaturated polyester resin "Rigolac #2025C", 1.5 parts methylethyl peroxide and 0.5 part cobalt naphthenate was spray coated on the surface having said pattern and cured at room temperature. After curing, the overcoat was wet-sanded and then buffed.

Thus, a glossy, beautiful decorative plate having a somewhat smokey rose-red tone appearance.

Example 7

A mixed resin comprising 70 parts photocurable vinylester resin "VR-77" by Showa Kobunshi K. K., 25 parts trimethylolpropane, 5 parts acrylic acid and 1 part benzophenone was coated 0.2 mm thick on a greenish cashmere onyx pattern printed film employed in Example 1 with the pattern in contact with said resin. Then the film was coated on the side of coated with said resin. The resultant assembly was subjected to irradiation by five, 1 kW sunlamps having a 370 mμ wavelength UV harmless to the eye at a distance of 20 cm for 2 to 3 minutes to convert the mixed resin to a gel. The film having a jelly-like adhesive layer thus obtained is stable for more than a half year if not exposed to light.

The gelled layer carrying film was pressed onto an aluminum metal plate, 300×300×5 mm³, with the gelled layer in contact with the metal after stripping the polyethyleneterephthalate film and then the metal-gel layer product was passed 20 cm under a 30 kW output UV irradiation means at a speed of 5 m/min. to cure the gelled resin. There is thus obtained an aluminum plate having a cashmere onyx pattern on the surface of the resin upon stripping the film.

The plate thus obtained was further coated 0.1 mm thick with an acrylic lacquer by Kansai Paint K. K., "Acrylic GL 2026" which is an acrylic thermoplastic type not containing an isocyanate type curing agent, and then subjected to buffing after drying. An aluminum plate having a beautiful cashmere onyx pattern was thus obtained.

Example 8

A photocurable vinylester resin "Ripoxy VR 77" by Showa Kobunshi K. K. was coated 0.2 to 0.3 mm thick on the surface of a slate plate 300×300×5 mm³ and then a polyvinylalcohol type "Vinylone" (trade name) having a deep red-black-yellow three colored discrete water-drop like pattern printed with an ink prepared by pigmenting an acrylic type resin emulsion, was pressed onto the resin layer and the resultant assembly was subjected to 4 megarads of energy produced by a Van de Graaff accelerator to cure the resin. Upon stripping the film the pattern had been transferred to the cured resin. The cured resin surface having the transferred pattern thereon was further brush coated with "Ripoxy VR 77" resin 0.1 to 0.2 mm thick and the resin of the resultant product was cured with an electron beam of 2 megarads from the same accelerator as set forth above.

There was thus obtained a decorative slate plate having a water-drop like pattern relief seemingly in against the substrate. It should be noticed that an electron beam can completely cure a resin placed under a black like pattern through which UV light cannot pass, along with the transfer of the pattern to the cured resin.

Example 9

To a mold employed in Example 1 the following mixed slurry comprising:

| | | |
|---|---|---|
| 85 parts | white portland cement | |
| 15 parts | while anhydrous gypsum | |
| 100 parts | white silica | |
| 1 part | "melment" (water reducing agent on the basis of melamine type resin by Showa Denko K.K.) | |
| 60 parts | water | | was poured and set. After standing for 3 hours the set product was steam cured at a temperature of 70° C. to 75° C. for 3 hours followed by standing at room temperature.

A resinous composition comprising 100 parts unsaturated polyester resin, "Rigolac #2004" by Showa Kobunshi K. K., 2 parts methylethylketone peroxide, 0.03 part accelerator E (trade name, Showa Kobunshi K. K.) 1 part benzoin isopropyl ether as a photoinitiator was spray coated 0.3 to 0.4 mm thick on the surface of the cured stock or substrate followed by intimately contacting a polyethyleneterephthalate film having a pattern two fashion models printed with a oil-modified alkyd type ink with the spray coated surface, and deaerating by passing it through rubber deaeration rolls.

The resultant assembly was then passed 20 cm under a 30 kW output UV irradiation means at a speed of 2 m/min. After the passage, the pattern was completely transferred to the cured resin surface upon stripping the film.

A mixed resin composition comprising 100 parts unsaturated polyester resin, "Rigoloc 2025C", 1.5 parts methylethyl ketone peroxide and 0.5 part cobalt naphthenate was spray coated 0.2 to 0.3 mm thick on the surface having the pattern set forth above and cured at room temperature.

The resultant product was subject to wet-sanding with #600 sand-paper followed by buffing and there was thus obtained a feautiful decorative plate with the pattern of two fashion models in seeming relief against the substrate.

If the resinous composition contained only benzoin isoprophyl ether as the catalyst, or initiator in the absence of the organic peroxide and the accelerator, the coated layer of said resinous composition wouldn't have cured at the part corresponding to the black hair, resulting in an incomplete transfer of the pattern.

Example 10

Into a mold similar to that in Example 1, a compounded slurry comprising:

| | |
|---|---|
| 100 parts | white cement |
| 100 parts | silica fine powder |
| 8 parts | "Expan" (trade name sold by Onoda Cement K. K. an Expanding agent) |
| 1 part | "Melment" |
| 10 parts | black colored pigment (SS Black CK-C, trade name, Sanyo Shikiso K.K.) |
| 0.2 part | hydroxyethylcellulose | was first poured to a thickness of about 2 mm. In 45 minutes. At a stage when the whole poured material had been changed to a uniform jelly-like state, the remaining thickness of 15 mm having the following composition was poured thereon to back the first poured material.

| | |
|---|---|
| 100 parts | Portland cement |
| 150 parts | pit sand |
| 10 parts | "Expan" (trade name by Onoda Cement K.K. a expanding agent) |
| 1 part | Melment |
| 3 parts | ¼" fiber glass |
| 10 parts | ethylene-vinylacetate emulsion containing 5 molar % ethylene. |

After standing overnight, the resultant product was steam-cured at 75° C. for 3 hours. After standing overnight within a room at 30° C. a photocurable resinous composition comprising 100 parts of vinylester resin "Ripoxy R-802" (trade name Showa Kobunshi K. K.) containing 10% glass beads, 3 parts of organic peroxide type curing agent No. 382 for vinylester sold by Kayaku-New, 0.5 part of cobalt naphthenate and 1 part of Irgacure #651, a photoinitiator (a dibenzyl ketal type) was brush-coated 0.4 onto 0.5 mm to the surface of the black pigment-containing solid cement. After converting the coated resin to a gel at room temperature, the same resinous composition was coated a 0.2 to 0.3 mm thickness thereon followed by immediate press-contacting with a polyethyleneterephthalate film having a landscape pattern printed with an aluminum lacquer comprising a nitrocellulose lacquer and a silver paint (an aluminum powder paste) facing the pattern to the vinylester resin layer and then cured.

The curing was effected by passing the assembly 20 cm under a 50 kW output UV irradiation device at a speed of 2 m/min.

Upon stripping the film the landscape pattern of silver paint had been completely transferred to the black colored underlayer.

On the surface having the landscape pattern a photocurable type "Spilac U-3155" was flow-coated 0.2 mm thick followed by passing it 20 cm under a UV irradiation device with a 50 kW output at a speed of 5 m/min.

The resultant product had a silver painted landscape pattern relieved against the black colored underlayer which appeared beautiful as to be usable as decorative stock. The coating has a hardness of 4 to 5.

Comparative Example 4

Example 9 was repeated except that "Irgacure #651" alone was used as the curing catalyst with a result that the resinous composition positioned under the silver colored landscape pattern remained as a jelly-like gel and thus the transfer of the pattern to that part was impossible.

Example 11

A resin solution comprising 100 parts of "Ripoxy VR-77" (trade name, Showa Kobunshi K. K., a photocurable vinylester resin containing no monomer), 1 part of Irgacure #651, and 1 part of lauroyl peroxide in 50 parts of vinylacetate was spray coated about 0.3 mm thick on a major surface of a white calcium silicate plate, 300×300×15 mm³ and air dried for about 3 hours within a room to produce a sticky surface coating. To the coating a polypropylene film having a "Sergino" marble pattern screen printed with an oily ink containing rosin-maleic acid resin based vehicle was press-contacted. The resultant assembly was then passed 20 cm under a 30 kW output UV irradiation device at a speed of 3 m/min. to cure the resin.

Thus, a calcium silicate plate having a transferred "Sergino" marble pattern thereon was produced upon stripping the film.

On the surface having the pattern "Acrylic 2026 GL Clear" (trade name, a curable type polyurethane paint sold by Kansai Paint K. K.) was spray coated about 70μ thick, followed by a buffing after curing.

Thus a calcium silicate decorative patterned plate having depth was obtained.

If lauroyl peroxide would be omitted, the resin placed under the deep grey colored part of "Sergino" marble pattern would be incompletely cured and the pattern of that part would upon stripping the film remain on the film without transferring to the resin. In this way, no commercially valuable product can be obtained.

Example 12

On the surface of cured-cement circular plate (prepared from 100 parts of white cement, 100 parts of white silica, 120 parts of water, 2 parts of "Melment", 3 parts of ¼" fiber glass, 20 parts of ethylene-vinylacetate resin emulsion and 10 parts of expanding agent)for covering cylindrical pole columns, a resinous composition comprising 100 parts of "Rigolac 150 HR" (a trade name, Showa Kobunshi K. K. an unsaturated polyester resin), 10 parts of styrene, 2 parts of methylethylketone peroxide, 0.03 part of cobalt naphthenate and 1 part of benzoinisobutylether was coated 0.4 to 0.5 mm thick, followed by immediate press-contacting of a polypropylene film on said coated resin layer, said film having a "brown travertin" marble pattern naturally occurring in Italy, printed with an oil modified alkyd type ink containing a ketone resin in combination, and the resultant assembly was passed 20 cm under a 30 kW output UV irradiation device at 5 m/min. speed to cure the resin.

Upon stripping the film, a circular outer plate for covering a round pole having a completely transferred brown "travertin" marble pattern thereon was obtained.

On the surface having said pattern was spray coated "Vinylol #92", a methylmethacrylate copolymer resin solution, produced by Showa Kobunshi K. K. as a thermoplastic clear lacquer.

Thus, a glossy, cylindrical, molded product with a seemingly naturally occurring relieved marble Example, with a surface hardness of H was obtained.

If benzoinisobutylether, a photoinitiator, alone were to be used, the cure of the underlying resin would be incomplete as a whole because of a deep yellowish brown coloring of the "travertin" pattern, resulting in the coating becoming crumbly and neither the transferrance of the pattern nor uniformity of the resin surface could be expected.

Example 13

A putty comprising 100 parts of "Rigolac #2245" (a trade name, an unsaturated polyester resin by Showa Kobunshi K. K.), 100 parts of talc, 50 parts of calcium carbonate, 1 part of methylethylketone peroxide and 0.5 part cobalt naphthenate was spread on a water-resistant plywood 300×300×9 mm³ and cured putty was ground to form a smooth surface.

On the smooth surface, a resinous composition comprising 100 parts of "Rigolac #2245" (a trade name, an unsaturated polyester resin, Showa Kobunshi K. K.), 1 part of methylethylketone peroxide, 0.03 parts of cobalt naphthenate and 1 part of benzoinisopropylether was brush-coated 0.5 to 0.6 mm thick and the resultant resin layer was intimately contacted with a polypropylene film having a blackish-violet colored rose-wood pattern printed with a lime cured rosin and rosin-maleic acid resin based oily ink with the printed surface in contact with the resin layer.

The resultant assembly was passed at room temperature under a 30 kW output UV irradiation device 20 cm spacing therefrom at a speed of 5 m/min. to cure the resin.

There was thus obtained upon stripping the film, a cured coating having a completely transferred rose-wood vein.

The same resinous composition as set forth above was coated 0.5 to 0.6 mm thick on the resin surface having the pattern and cured at room temperature followed by grinding and buffing. A beautiful decorative plate with a naturally occurring rose-wood appearance was produced.

If benzoinisopropylether alone were to be used, the UV irradiation would produce incomplete curing of the coated resin probably due to the deep colored rose-wood pattern, especially the part of deep colored pattern remaining on the film with the coated resin corresponding to that part of the pattern being at most cured in a such a soft state as merely somewhat stiff gelatine.

Example 14

A resinous composition comprising 100 parts of "Spilac U-3163", a photocurable spiroacetal type unsaturated acrylate resin containing a benzophenon photoinitiator produced by Showa Kobunshi K. K., and 1 part of tert. butylperbenzoate was coated 0.2 mm thick on the surface of transparent polycarbonate plate and a polyethyleneterephthalate film having a pansy flower pattern screen printed with an oil-modified alkyd type oily ink was press-contacted with the resultant coated resin layer. The assembly thus obtained was then passed at room temperature 30 cm under a 30 kW output UV irradiation device at 5 m/min. to cure the resin.

Upon peeling the film, a polycrabonate plate having a completely transferred flower pattern was produced.

A photocurable resin, "Spilac U-3155" of the same type and the same manufacturer was then coated 0.2 mm thick on the cured surface having the transferred pattern thereon and the freshly coated product was similarly passed under the same UV irradiation device at a speed of 3 m/min. to curing the resin.

A beautiful plate having a flower pattern in relief against the underlayer, with a surface hardness of the overcoat of 5H was obtained.

The sole use of U-3163 without the incorporation of peroxide would have resulted in a soft gel-like cure of the resin, which was totally unexpected to transfer the blackish violet colored parts of the pansy flower pattern.

Further, the use of tert. butyl perbenzoate with U-3163 base resin excluding the photoinitiator results in, under the same irradiation conditions, an uncured resin layer throughout the whole layer including that part lying under a transparent film.

Example 15

The surface of honeycomb sandwich plates made of FRP, $500 \times 500 \times 15$ mm$^2$, was ground with #320 sand paper. On said surface a resinous composition comprising 100 parts of "Ripoxy R-840" (a trade name of vinyl ester resin, produced by Showa Kobunshi K. K.), 1.5 parts of methylethylketone peroxide, 0.2 part of cobalt naphthenate and 1 part of dibenzyl, a photoinitiator was coated 0.1 to 0.2 mm thick and the coated resin was maintained at room temperature converting to a gel state. The gel state was kept for about one day.

A polypropylene film having a dark brown colored dappled pattern of the so-called "Botticino" veined marble that occurs in Italy, printed with a styrene-maleic acid copolymer type oily ink was adhered to the gel set forth above facing the pattern to the gel. The resultant assembly was passed at room temperature 20 cm under a UV light irradiation device at a speed of 5 m/min.

A honeycomb plate having a completely transferred "Botticino" pattern on the resin layer was produced upon stripping the film.

On the surface of said plate having the transferred pattern "Acrylic 2026 GL-Clear" (a trade name of a curable type of polyurethane clear paint produced by Kansai Paint K. K.) was spray coated 50 to 70 μm thick and the cured paint was buff treated as finishing.

There was thus produced a FRP sandwich structure plate having a natural marble-like appearance.

The use of dibenzyl alone would result in an unperfect curing of that part of the resin lying under the deep brown colored streaks of a Botticino pattern which makes it difficult to expect the transfer of the pattern at that part.

It should be noted that in the above case where dibenzyl alone was used, the printed film was adhered to the resin layer in a liquid state rather than in a gel state.

Example 16

A non-woven fabric, "Panelon #2502" (a material based on polyester-nylon-rayon, Dinic Co.), $600 \times 600$ mm$^2$ was superposed on a polyethyleneterephthalate film, having the same sizes but 0.2 mm in thickness and the resultant laminate were impregnated with a photocurable unsaturated urethane-acrylate resinous composition comprising 100 parts of urethane acrylate having a formula: $C=C-R_1-R-R_1-C=C$ wherein group $-C=C$ represents a 2-hydroxy ethylacrylate residue, $R_1$ represents 1, 6-hexamethylene diisocyanate residue, and R represents a polyhydroxy-polyester residue, 30 parts ethyl acrylate, 20 parts trimethylol propanetriacrylate, 50 parts 1, 6-hexanediol diacrylate, 2 part photoinitiator, sold under the trade name of "IRGACURE #651" by Ciba-Geigy Co. and 1 part of benzoyl peroxide, said photocurable unsaturated urethane acrylate resin being prepared by reacting a polyhydroxy-polyester synthesized from adipic acid and ethyleneglycol and having an acid number of 1.9 and a hydroxyl number of 54.1, 6-hexamethylenediisocyanate and 2-hydroxy ethylacrylate together.

A polyethyleneterephthalate film having a printed brownish cashmere onyx pattern as employed in Example 2 was press adhered to the impregnated surface with its printed surface in contact therewith. The resultant assembly was passed 20 cm under a 30 kW output UV irradiating means at 5 m/min. at room temperature to cure the resin.

A cashmere onyx pattern transferred on the cured impregnated surface of urethaneacrylate resin of the unwoven fabric was obtained upon removing the film.

Then, the same resin was coated 0.2 mm thick on the transferred pattern by a flow coater and the resultant product was passed 20 cm under the same UV irradiation means at 2 m/min. at room temperature. There was obtained a freely flexible, supple decorative plate having a translucent brownish cashmere onyx pattern through which the base unwoven fabric can be seen.

If "IRGACURE #651" only were employed, a similar phenomenon to that in comparative Example 1 occurs so that no complete transfer can be achieved.

On the other hand, the use of benzoyl peroxide only, of course, can give rise to no cured resin whatsoever even after passing under the UV irradiation means, and even if the cure is forced by extending the time period under irradiation by stopping the conveyer for six minutes, gelling commences only with many blisters of varying sizes foaming throughout the surface. Thus no uniform product which is suitable for practical applications is obtained.

Example 17

On a cured gypsum plate prepared as in Example 1 100 parts of photocurable resin "SPILAC U-3155" to which is added 1 part of benzoyl peroxide was coated 0.3 to 0.4 mm thick and then a pattern-printed film was placed so as to adhere the coated resin with the pattern. The pattern printed film was prepared by screen printing a black serpentine pattern on a polyethyleneterephthalate film with an ink prepared by incorporating an appropriate pigment into a vehicle comprising a photocurable vinyl ester resin sold by Showa Kobunshi K. K. under the trade name of "SP-1509" to 100 parts of which is added 3 parts of "IRGACCURE #651" and 2 parts of benzoyl peroxide and then by curing the resin to an acetone insoluble state by passing the printed film 20 cm under a 30 kW output UV irradiation means at a speed of 3 m/min.

The resultant assembly was passed at room temperature 20 cm under a 50 kW output UV irradiation means at a speed of 2 m/min. to cure the resin.

There was thus obtained a cured coating on which a black serpentine pattern was transferred upon removing the film.

A transparent curable polyurethane resin sold by Kansai Paint K. K. under the trade name of "ACRYLIC 2026 G-Clear" was spray-coated about 70 μm thick on the pattern-bearing surface.

After finishing by buffing, a mold product bearing a black serpentine pattern having apparent depth, the depth of which seems to exceed that of real marble, was obtained.

No curing of the resin occurred at the part of the resin under the black serpentine pattern with the use of "U-3155" alone resulting in a product bearing an incompletely transferred pattern.

If "U-3155N" (which contains only benzoyl peroxide, without adding a photoinitiator, in a U-3155 base resin) alone was used, the resin was not cured over the whole coated surface, remaining in a liquid state.

What is claimed is:

1. Method for imparting a pattern to a stock or shaped body consisting essentially of:
   coating said stock or shaped body with an active energy beam curable resin;
   contacting the resin with a film having a releasable pattern printed thereon at a stage where the resin is in a liquid or sticky gelled state prior to curing, said pattern being printed with an ink having a greater affinity for said resin than for said film, irradiating a beam on the pattern-printed film-resin coated body to cure the resin, concomitantly transferring the pattern on the film to the cured resin surface, peeling the film from the cured resin surface and thereafter coating the transferred pattern bearing cured resin surface with a transparent or translucent resin.

2. The method according to claim 1 wherein the active energy beam is an electron beam.

3. The method according to claim 1 wherein the active energy beam is a UV light or sun light.

4. The method according to claim 1, wherein the active energy beam is a UV light or sun light and wherein the resin contains a photoinitiator.

5. The method according to claim 3 wherein the resin further includes an organic peroxide.

* * * * *